United States Patent [19]

von Kraewel

[11] Patent Number: 4,804,434
[45] Date of Patent: Feb. 14, 1989

[54] VERTICAL PWB SUPPLY SYSTEM

[75] Inventor: Hasso R. von Kraewel, Mauldin, S.C.

[73] Assignee: Digital Equipment Corporation, Maynard, Mass.

[21] Appl. No.: 805,121

[22] Filed: Dec. 4, 1985

[51] Int. Cl.[4] .............................................. B65C 9/40
[52] U.S. Cl. .................................... 156/364; 156/522
[58] Field of Search ............................... 156/361–364, 156/522, 552, 501, 301; 53/51, 64, 591, 550; 198/626

[56] References Cited

U.S. PATENT DOCUMENTS

| | | | |
|---|---|---|---|
| 2,889,941 | 6/1959 | Mehlis | 198/626 X |
| 3,140,971 | 7/1964 | Creseenzo | 198/626 X |
| 3,586,586 | 6/1971 | Berg | 156/519 |
| 3,856,132 | 12/1974 | Sakurai | 198/626 X |
| 4,070,226 | 1/1978 | Crathern et al. | 156/364 |
| 4,214,936 | 7/1980 | Del Bianco | 156/361 X |
| 4,525,977 | 7/1985 | Matt | 53/550 X |
| 4,680,079 | 7/1987 | Tanaka | 156/552 X |

Primary Examiner—David Simmons
Attorney, Agent, or Firm—Arnold, White & Durkee

[57] ABSTRACT

The present system provides structure to automatically load vertically positioned printed wire boards (hereinafter PWBs), into a processing "line." The present system employs a movable loader device. The movable loader device has multiple levels of PWB rack-cassettes. The rack-cassettes are loaded, into the movable loader device, with PWBs, prior to the movable loader device being engaged with the remainder of the system. Thereafter the movable loader device is rolled on wheels, to be in contact with a locking device, whereat it is secured, so that the PWBs can be precisely aligned with the index-loader-cassette of the processing "line." The PWBs are automatically moved from the index-loader-cassette into and through the transport path. The system further has, in the embodiment described, a masking tape applicator arrangement which can either automatically apply masking tape in uncut form to the PWBs or alternatively can cut patterns from masking tape so that when the masking tape is subsequently applied to the PWBs, certain areas of the PWBs, which are not covered by the masking tape or which are defined by the cut-out patterns, are exposed for future plating. The movable loader device includes a pneumatic lifting system.

15 Claims, 13 Drawing Sheets

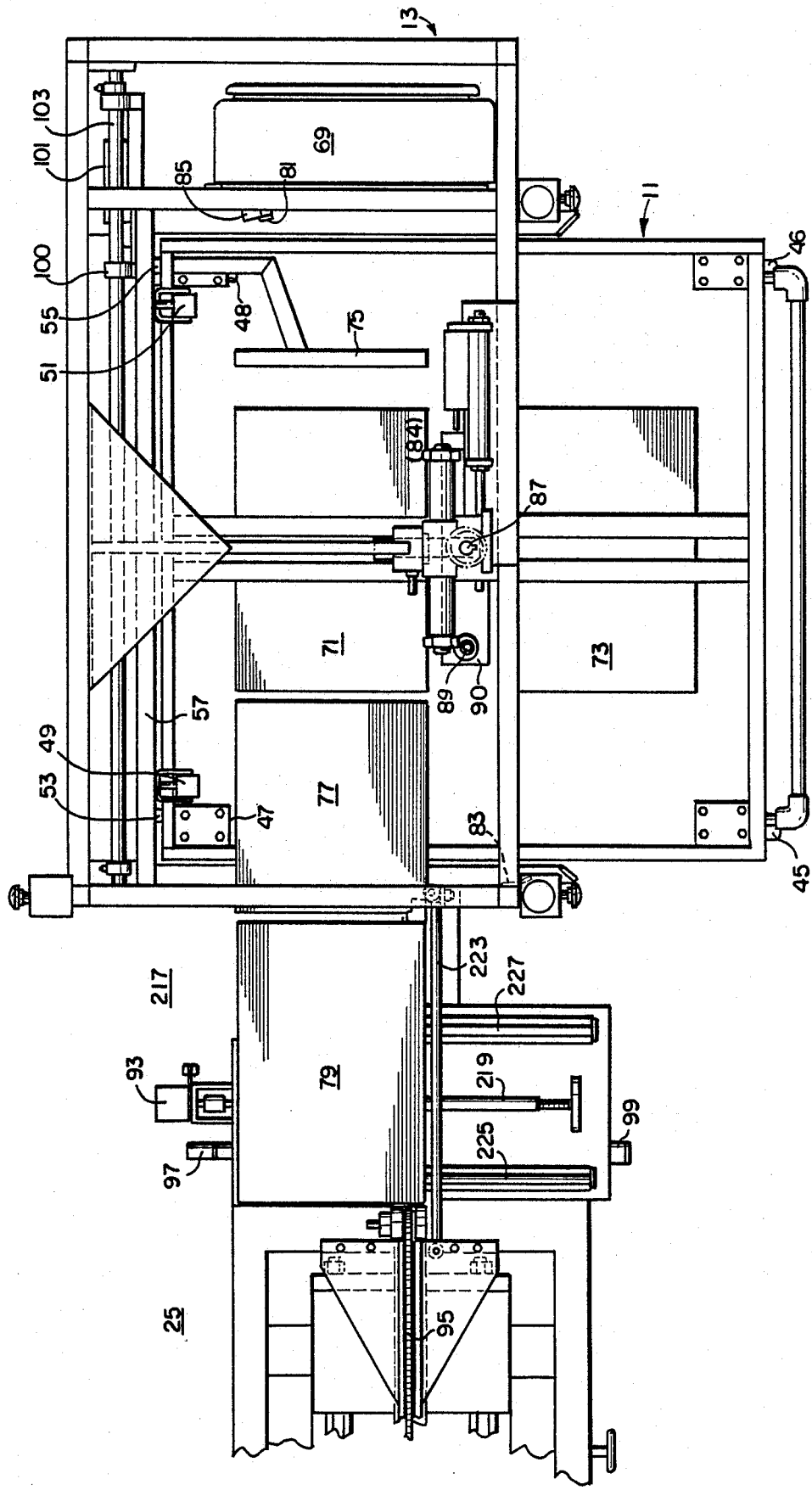

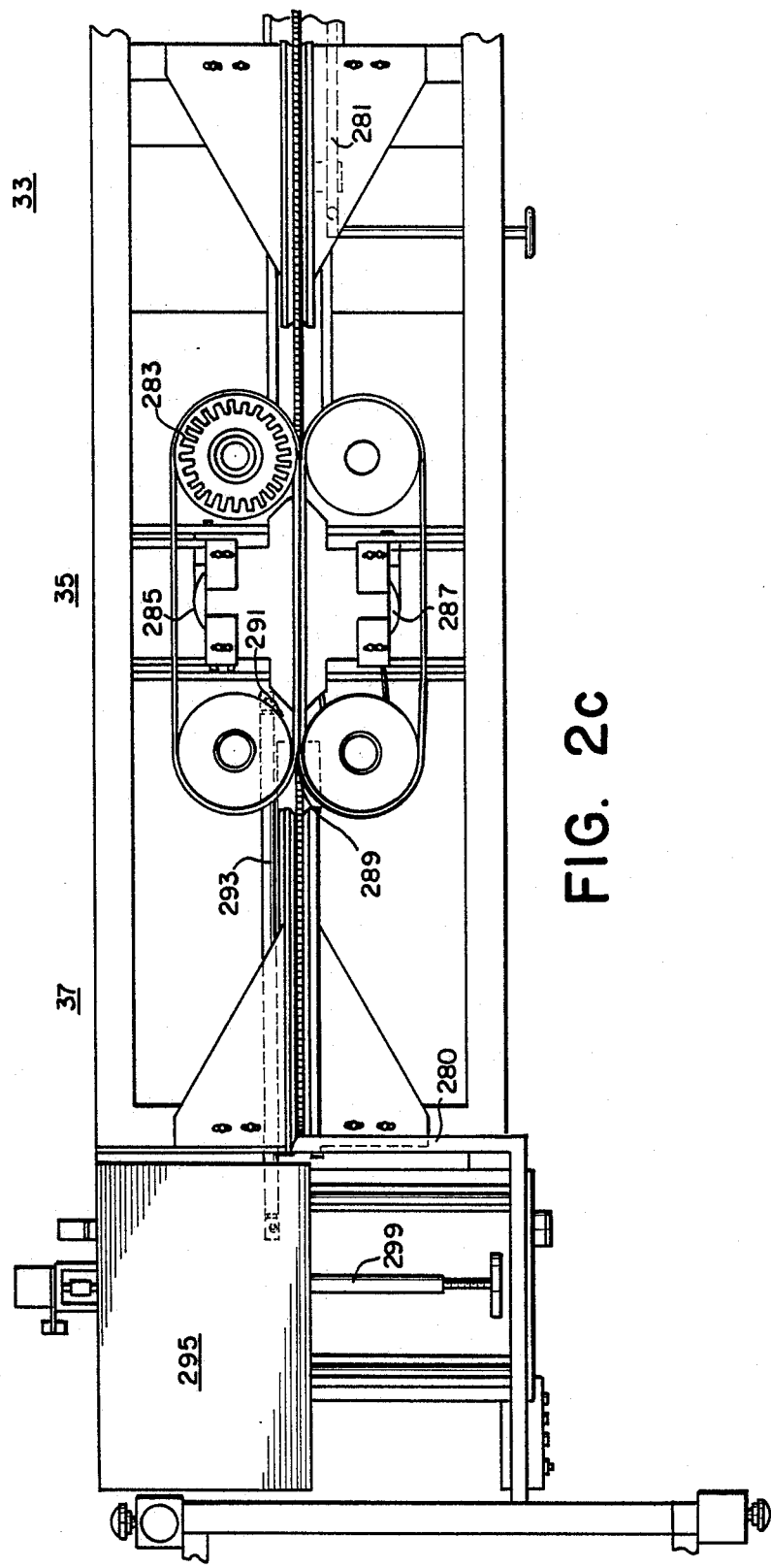

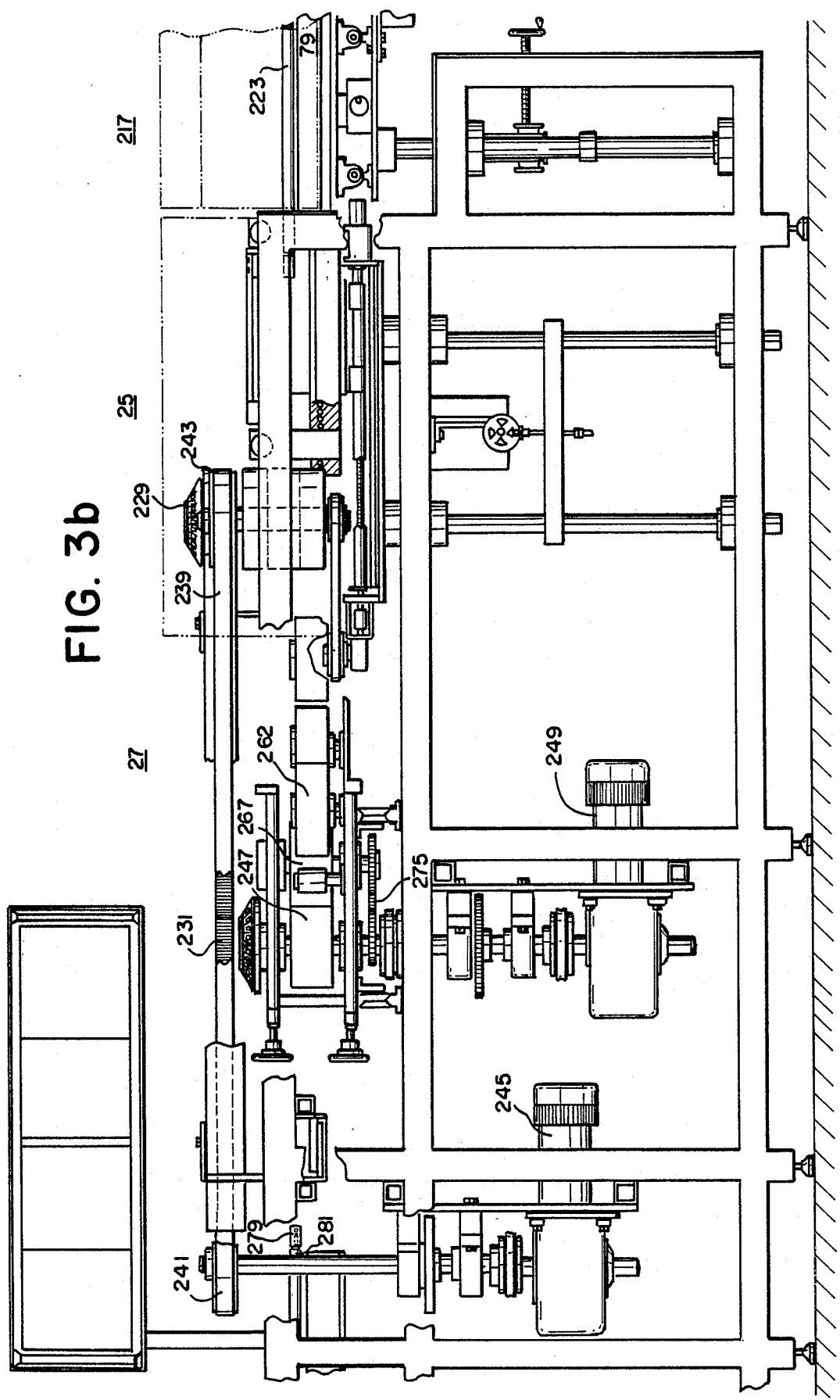

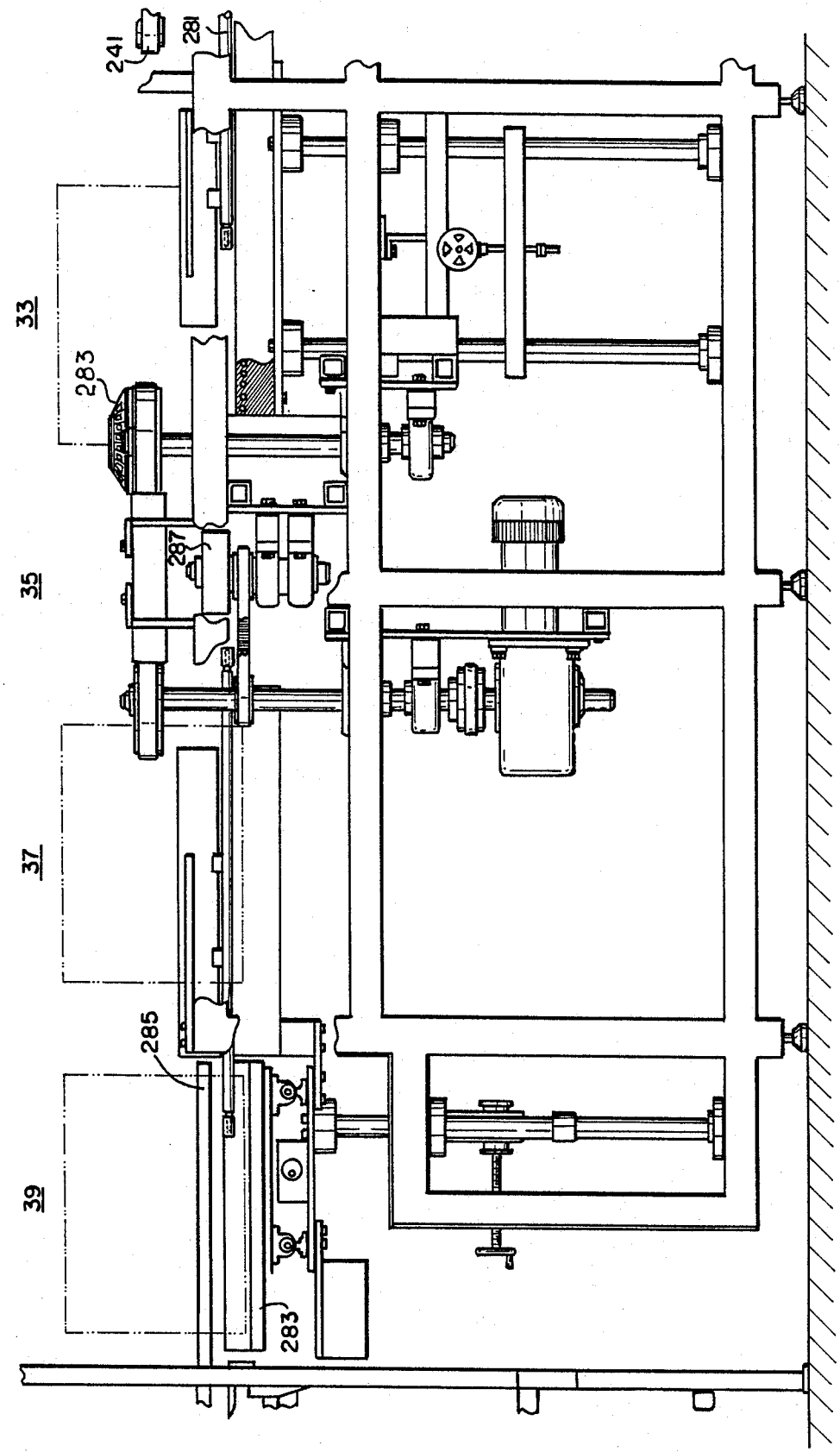

VERTICAL PWB SUPPLY SYSTEM

BACKGROUND

It is well understood, in the art of fabricating PWBs, that certain circuit sections need a special coating, such as gold plating the terminals that intermesh with other circuitry in backboard wiring. Although in a processing "line" it is desirable to move PWBs therethrough in vertical positions, heretofore such PWBs have not been automatically loaded into such processing "lines" while being in vertical positions. Instead, in the prior art, if a processing "line" were designed to operate with vertically positioned PWBs, such PWBs were and are manually fed into the processing "line." It is also well understood that in plating operations, directed to PWBs, it has been the practice to prevent certain circuit areas from being plated by either covering the prohibited areas with masking tape or by effecting a cover, for the prohibited areas, with a "developed" photo resist. The masking tape technique of the prior art which at best is semi-automatic, has proven to be labor intensive (and therefore costly), as well as being somewhat inaccurate. On the other hand, the photo resist technique is reasonably accurate but it is quite costly. The present system employs a masking tape technique, but it is a vast improvement over the prior art method because the present system automatically feeds the PWBs while they are held in vertical positions and both automatically and accurately applies masking tape which may in one mode be without cut-outs and which in another mode has cut-outs removed therefrom. The masking tape which has had the patterns cut therefrom is placed over the PWBs in exact and desired positions but leaves certain sections unprotected so that said certain sections can be plated.

SUMMARY

The present system employs a movable loader device with a multiple level rack device which holds cassettes in which PWBs are held vertically. The movable loader device is moved into contact with a locking device whereat it is secured so that a pneumatic control system and an electronic control system can cause the many cassettes to be moved, respectively at specific times, in order to present one cassette at a time aligned with a feeding position. Because the movable loader is secured to the locking device, when a rack-cassette loaded with PWBs is moved, into the feeding position, the slots on such a rack-cassette are precisely aligned with the slots of a bridge member on the locking device, and are further precisely aligned with slots of indexing-loader-cassette which is part of the processing hardware. A pusher member, which is part of the locking device, automatically pushes a set of PWBs from whichever of the rack-cassettes is in the feeding position, across the bridge member, to the indexing-loader-cassette. The PWBs are automatically fed from the indexing-loader-cassette, one PWB at a time, into the transport path of a processing system. In the embodiment described herein, the PWBs are moved serially, through the processing system, and masking tape is applied with or without cutting patterns therefrom. If patterns are to be cut from the masking tape, then prior to applying the masking tape, a rotary die cuts patterns therefrom so that areas of the PWBs, which lie under the cut-a-way positions of the masking tape, can be exposed to a plating solution at sometime in the future. Accordingly the exposed areas (i.e., areas lying outside of the masking tape as well as those areas lying under the cut out sections) will get plated, when the PWBs pass through the reservoir of a plating solution of such a plating system.

The objects and features of the present invention will be better understood in view of the following description taken in conjunction with the drawings wherein:

FIG. 1 is a block diagram of the embodiment described hereinafter;

FIGS. 2a and 2d taken together represent a detailed top view of the embodiment described hereinafter;

FIGS. 3a and 3d taken together represent a detailed side view of the embodiment described hereinafter;

The present invention is described as it is employed in a system to apply masking tape to printed wire boards (PWBs). The present invention can be readily and usefully employed in many systems where materials are to be processed or handled automatically along a processing "line" or an assembly "line."

Figure 1:
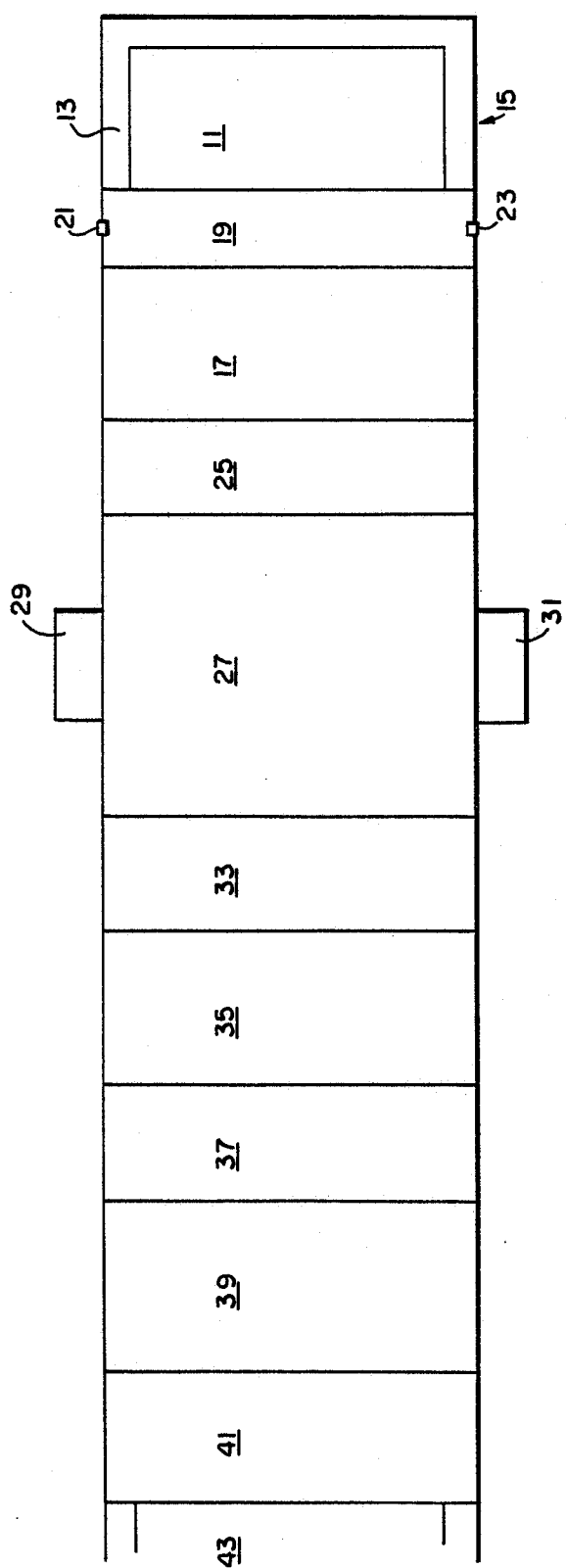

Consider FIG. 1, wherein there is shown a movable PWB loader device 11. The PWB loader device 11 includes multiple levels of rack-cassettes. It should be understood that the cassettes, in this particular system, are devices with numerous channels formed therein and in each of the channels there is initially loaded a PWB. As will become better understood hereinafter, in the movable loader device 11 there are formed, in the preferred embodiment, six rotatable double rack-cassettes, and on each of these rack-cassettes, there is held a plurality of PWBs. The rack-cassettes are initially loaded with PWBs manually, or automatically before the loader device 11 is moved into the locking device. In other words the loader 11 is loaded externally to the system. It should be noted in the block diagram of FIG. 1, that the frame 13 is a locking device and it surrounds the movable PWB loader 11. Actually, the movable PWB loader 11 is pushed through the end of the locking device 13, as indicated by the arrow 15. When the movable loader device 11 is located within the locking device 13, it is secured to the locking device 13 with pneumatic toggle clamps (to be described hereinafter), and is hence locked into an air system for pneumatic control purposes.

Coupled to the locking device 13 and formed to bridge the gap between a rack cassette located in the feeding position and the index-loader-cassette 17, is a ramp device 19. As will become more apparent when the system is studied in detail, the ramp device 19 has a plurality of grooves therein and is further formed so that it partially swivels on the hinges 21 and 23. The grooves, in the ramp device 19, are formed to permit PWBs to slide along said grooves as they are pushed, from a rack-cassette held by the portable loader 11, into matching grooves which are found in the indexing-loader-cassette 17.

After the portable loader 11 is located in the locking device 13 and coupled to the air supply, then the ramp device 19 is partially swiveled clockwise so that the grooves in the ramp device 19 match with the grooves in the particular rack-cassette that is current in the feeding position of the movable loader 11. Accordingly, the grooves in the last mentioned rack-cassette "line up" with the grooves in the indexing-loader-cassette 17.

When the foregoing arrangement is, in fact, in being, then the system is "turned on" and PWBs from the rack-cassette, which is in the feeding position, are pushed by a pusher device from the movable loader 11, across the ramp device 19, into the indexing-loader-cassette 17. Thereafter, the PWBs are pushed, individually, that is to say one board at a time or step by step, from the indexing-loader-cassette 17 into the first transfer station 25. Each PWB is aligned by conical pins in the transfer station and then moved therefrom into the nip of a pair of rotating belts which are located in the tape application station 27. A PWB which is next ready for movement from the transfer station 25 remains momentarily thereat until a signal from the electronic control system indicates that it should be moved from the transfer station 25 into the nip of the rotating belts in the masking tape application station 27. The PWBs entering the masking tape application station 27 are advanced from the transfer station 25 in such a way that there is a discreet distance (i.e., a gap) between the end of one PWB and the beginning of the following PWB. The masking tape is continuously applied to the PWBs and accordingly there is masking tape lying across the gap between the end of one PWB and the beginning of another. As will be described hereinafter, the tape which is located across the gap, between one board and a subsequent board, is cut, by a cutting device, as the train of PWBs passes through the system. This last mentioned cutting provides that each PWB will end up with two tabs. One such tab overhangs the front edge of the PWB and the other tab overhangs the trailing edge of the PWB. When the masking tape has served its purpose, i.e., has prevented undesirable plating of the PWB, then the masking tape is removed and the tabs provide a means to grab hold of the tape and pull it away from the PWB.

Adjacent to, and actually part of, the masking tape application station 27 are two rotary die devices 29 and 31. For some operations, it is desirable to cut and remove certain portions of the masking tape to form desirable patterns. After the patterns have been formed and after the masking tape has been applied, a selected portion of the circuit path will remain uncovered and therefore will be subject to being plated, while the surrounding area will be kept free of the plating material. In order to provide the "cut-outs" to accomplish the foregoing, the rotary dies 29 and 31 are used. The rotary dies are formed to cut out the desired patterns and leave a hole, or holes, in the masking tape which is applied to the PWB. In order to remove the "cut-outs," the system provides a backing tape which has an adhesive characteristic on the side that joins the masking tape. The depth of the cut by the rotary die 29 is arranged so that the backing tape is not cut, thus providing a solid adhesive behind the cut outs. Accordingly, the "cut-outs" stick to the backing tape and are literally pulled from the masking tape. It follows that the masking tape which is applied to a PWB and which has cut-out portions (which are free of material) provides for having sections of the circuit paths (defined by the cut-outs) unprotected and free to be plated. It should be noted that the rotary die 29 (and its associated masking tape supplier and backing tape supplier) operates to apply masking tape to a first side of the PWB, while rotary die 31 (and its associated masking tape supplier and backing tape supplier) operates to apply masking tape to a second side of the PWB. Hence, when a PWB leaves the masking tape application station, it, in fact, has masking tape applied to two sides. If for some reason the user wants the system to apply masking tape to one side only, then one or the other of the suppliers represented by the blocks 29 and 31 is non-operative.

There is also located within the masking tape application station 27 a control signal generating means. In the preferred embodiment, the control signal is generated by the substantial coincidence of two signals generated, respectively, by a first and second rotary transducer. As will be explained in more detail hereinafter, a PWB passing through the masking tape application station 27 must arrive at exactly the correct time with respect to the application of the masking tape. If the tape is not applied to a PWB at exactly the correct time, the cut-out sections will end up being located over parts of the circuit which, in fact, should be protected by being covered. The two rotary transducers provide the signal basis for moving a PWB into the nip of the belts in the masking tape application section 27, so that the PWBs arrive respectively at the point of application of the masking tape at the correct times.

When a PWB leaves the masking tape application station 27, it is passed into the second transfer station 33, whereat it comes to rest until the electronic control signals provide a signal to a pusher in the second transfer station 33, which advances the PWB into the buffing station 35.

At the buffing station 35, the masking tape is pressed with vigor into the PWB so that the voids between the circuit paths are "filled in" with masking tape and hence no plating material can adhere thereto to provide undesirable circuit connections between th circuit paths on the PWB.

Each PWB is advanced from the buffing station 35 into a third transfer station 37, across which it is advanced into the final discharge station 39. In the final discharge station 39, there is a section which is the equivalent of the indexing-loader-cassette 17. The PWBs are individually loaded, automatically, into a cassette in the final discharge station 39. When a cassette has been filled with PWBs, they are moved as a group automatically across the ramp device 41 into a movable receiving device 43, which is only partially shown in the block diagram. The ramp device 41 is similar to the ramp device 19, and the portable receiving device 43 is similar to the movable loader device 11. The operation of the system as just described in connection w&th FIG. 1 is an overall view, and now let us consider the details of the system as shown in the detailed top view of FIGS. 2a and 2b.

As we consider the details of the system, it should be understood that when the movable loader device 11 is positioned and clamped into the locking device, the system moves the PWBs into the transport path in accordance with a sequence of events which are programmed into a programmable controller. As will become evident from the following description, there are proximity switches installed which signal to the controller that the sequence has ended. Thereafter, the controller will move on to the next sequence, until all of the rack cassettes are empty. When all of the rack cassettes are empty, the rack is lowered to its home position and the movable loader can be pulled out of the locking device and replaced by a second loaded movable loader device.

In FIG. 2a there is shown a movable loader device 11 which is pushed into the locking device 13. The movable loader device 11 is pushed, in the direction of the arrow 15, into the locking device 13. As can be seen from FIG. 2a, the movable loader device 11 rides on four wheels, 45, 46, 47 and 48. When the movable loader device 11 is pushed into its "in" position, it is locked by the pneumatic toggle clamps 49 and 51. Actually there are four such clamps and bearing in mind that FIG. 2a is a top view, it should be understood that the remaining two clamps lie below the clamps 49 and 51 respectively. In a preferred embodiment, the pneumatic clamps are pneumatic toggle clamps manufactured by Carr Lane Mfg., Co. When the clamp 49 is locked, a nozzle-like projection is forced into an air conduit 53 and a similar nozzle is forced into air conduit 55 in response to the locking of clamp 51. The air conduits 53 and 55 receive pressurized air from an air supply through a conduit located in the crossbar 57. The nozzles which fit into the conduits 53 and 55 are locked into an air supply (not shown) which provides pneumatic action capability to the system as will be referred to from time to time hereinafter. It should be understood that the air supplied to the conduits 53 and 55 is further transmitted, through conduits, within the frame of the movable loader device 11, into the cylinders 59, 61, 63 and 65 shown in FIG. 3a. It should also be understood that the pneumatic control system is located in housing 67 (FIG. 3a) while the electronic control system is located in housing 69 (FIGS. 2a and 3a). The pneumatic control system in a preferred embodiment is manufactured by Telemecanique Co. of France. The electronic control system in a preferred embodiment, is manufactured by McGill Co. Since the pneumatic and electronic control systems are commercially available devices, there will be no detailed description thereof other than to refer to the fact that certain pneumatic and electronic control signals are respectively generated by each. As can be seen in FIG. 2a and FIG. 3a, there is a first upper (level 1) rack cassette 71 and a second upper rack cassette 73. As explained earlier, a rack-cassette has grooves therein and the grooves are formed to hold PWBs (shown in phantom in FIG. 3a). As will be better seen in FIG. 3a, which is a side view of the movable loader 11, the movable loader 11 accommodates six such rack-cassettes. While the movable loader 11 is shown having a capacity for holding six cassettes, it should be understood that other numbers of cassettes could be accommodated providing the structure of the movable loader 11 were changed to accommodate some other number, such as eight or ten. As can be gleaned from FIG. 2a, there is shown to the right of the first upper rack cassette 71, a pusher device 75. The purpose of the pusher device 75 is to move from right to left, in the drawing, and move the entire collection of PWBs from the cassette 71, across the ramp device 77 and onto the indexing-loader-cassette 79. The ramp device 77 was described in connection with FIG. 1 as items 17 and 41. The ramp device has a plurality of grooves therein and those grooves must be matched with the grooves of each movable loader cassette as it is located in the feeding position, i.e., the position to feed PWBs onto the indexing-loader-cassette 79. Accordingly, when the locking devices 49 and 51 (and the other two which lie below the locking devices 49 and 51) are in fact "locked in," the grooves of each of the rack cassette as it gets moved into the feeding position, indeed match up with the grooves on the ramp device 77. Thus when the pusher 75 moves the entire collection of PWBs over the ramp device 77, those PWBs are transferred into matching grooves and as the pusher 75 continues its excursion those PWBs are loaded, in mass, onto the indexing-loader-cassette 79. The system is made aware of a full excursion of the pusher 75 to the left, by virtue of a signal from the proximity switch 86 (FIG. 3a). When such a signal is generated by the proximity switch 86, the electronic control circuitry forces the pneumatic control means to reverse the rodless cylinder 101 and hence the pusher 75 is returned to its home position. In addition there is a mechanical stop 88 (FIG. 3a) for the rodless cylinder 101.

When the PWBs, which were originally in the rack cassette 71, have been moved out of the position shown in the drawing, a new cassette is moved into the position at which cassette 71 is shown in the drawing and this is accomplished by rack rotation. In order to provide the new cassette, after the first cassette 71 is unloaded, the system needs to know that the pusher 75 is in the "home" position. A microprocessor in the controller 69 responds to the return of the pusher 75 by virtue of a signal from the proximity switch (not shown) located in the home position. Such a signal, causes the pneumatic control means to actuate the rotating torque actuator which rotates a shaft 87. The shaft 87 in turn rotates a bar 90 to which both the rack cassettes 71 and 73 are attached through the vertical support rods 89 and 91, thus causing the rack cassette 73 to be moved into the position previously occupied by the rack cassette 71. During this operation the ramp device 77 is moved upward so that the racks which are being rotated can be clear of the ramp device 77. The ramp device 77 is moved up, rotating ninety degrees, by the pneumatic device 92 (FIG. 3a). In a preferred embodiment, the pneumatic device 92 is a Bimba Air Cylinder manufactured by Scott Equipment Company. Now even though the pusher 75 may be in its home position, the pusher 75 is not immediately signaled to push the PWBs from cassette 73 across the ramp cassette 77 onto the indexing-loader-cassette 79. It should be understood that in the course of emptying the indexing-loader-cassette it is moved and it must be returned to its home position before the PWBs are loaded thereon. The pusher 75 is advanced when the indexing-loader-cassette 79 is emptied of its last PWB and has been returned to its home position. The returning of the indexing-loader-cassette is effected by first having the electronic control system count to fifty (one full load of PWBs) in synchronism with the stepping motor 93. In a preferred embodiment, the cassettes each hold fifty PWBs and hence when the stepping motor 93 has stepped fifty times, each of the PWBs held by the indexing-loader-cassette 79 should have been moved from the indexing-loader-cassette 79. When the electronic control system has counted to fifty in synchronism with the stepping motor 93, the system is alerted to the fact that the last PWB is being moved from the indexing-loader-cassette. Thereafter as the last PWB is pushed from the indexing-loader-cassette 79 into the transfer station 25, a signal is generated by the emitter receiver 97. Thus an electrical signal will be sent to the controller 69 indicating that the cassette 79 is empty. This last mentioned signal is used to reverse the stopping motor 93 at high speed and thus the empty indexing loader cassette is quickly returned to its home position. A home position of the indexing-loader-cassette generates a signal to advance the pusher 75 to cause all of the PWBs on the rack cassette 73 to be moved therefrom across the ramp device 77 onto the indexing-loader-cassette 79.

The pusher 75 is operated by being attached to a frame 100 which is secured to a rodless cylinder 101. In a preferred embodiment, the rodless cylinder is an Origa Rodless cylinder built by the Origa Company, Inc., but it should be understood that other forms of pneumatic movement devices could be used. The rodless cylinder 101 is moved bidirectionally. The rodless cylinder structure holding the pusher 75 is further secured to two guide rods 103 and 105 (FIG. 3a). When the cylinder 101 moves to the left, it moves the pusher 75 to the left. As mentioned earlier, when the rodless cylinder 101 gets to the proximity switch 86 a signal is generated which indicates the end of the travel of the pusher and also provides a signal to the controller 69 which causes the pneumatic control means 67 to reverse the rodless cylinder 101 so that it moves to the right in the drawing.

Consider now the makeup of the movable loader device 11 as it is seen in FIG. 3a. In FIG. 3a the movable loader device 11 is locked, or positioned, in the locking device 13. As can be further gleaned from FIG. 3a the movable loader device 11 has been wheeled into the locking device 13 and, as has been described earlier, it is locked in the locking device 13 by the toggle clamps 49, 50, 51 and 52.

Figure 3A:
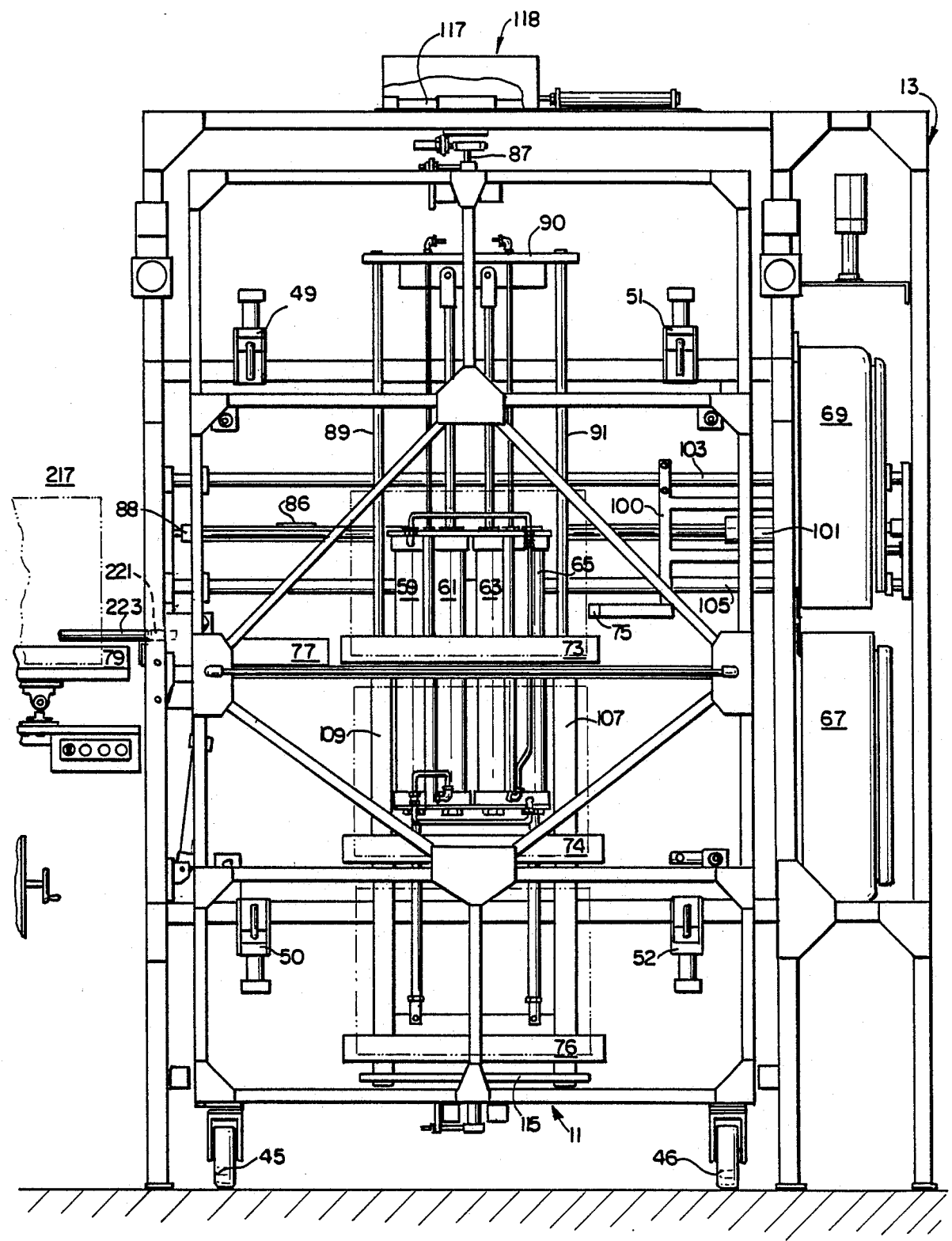
Figure 3D:
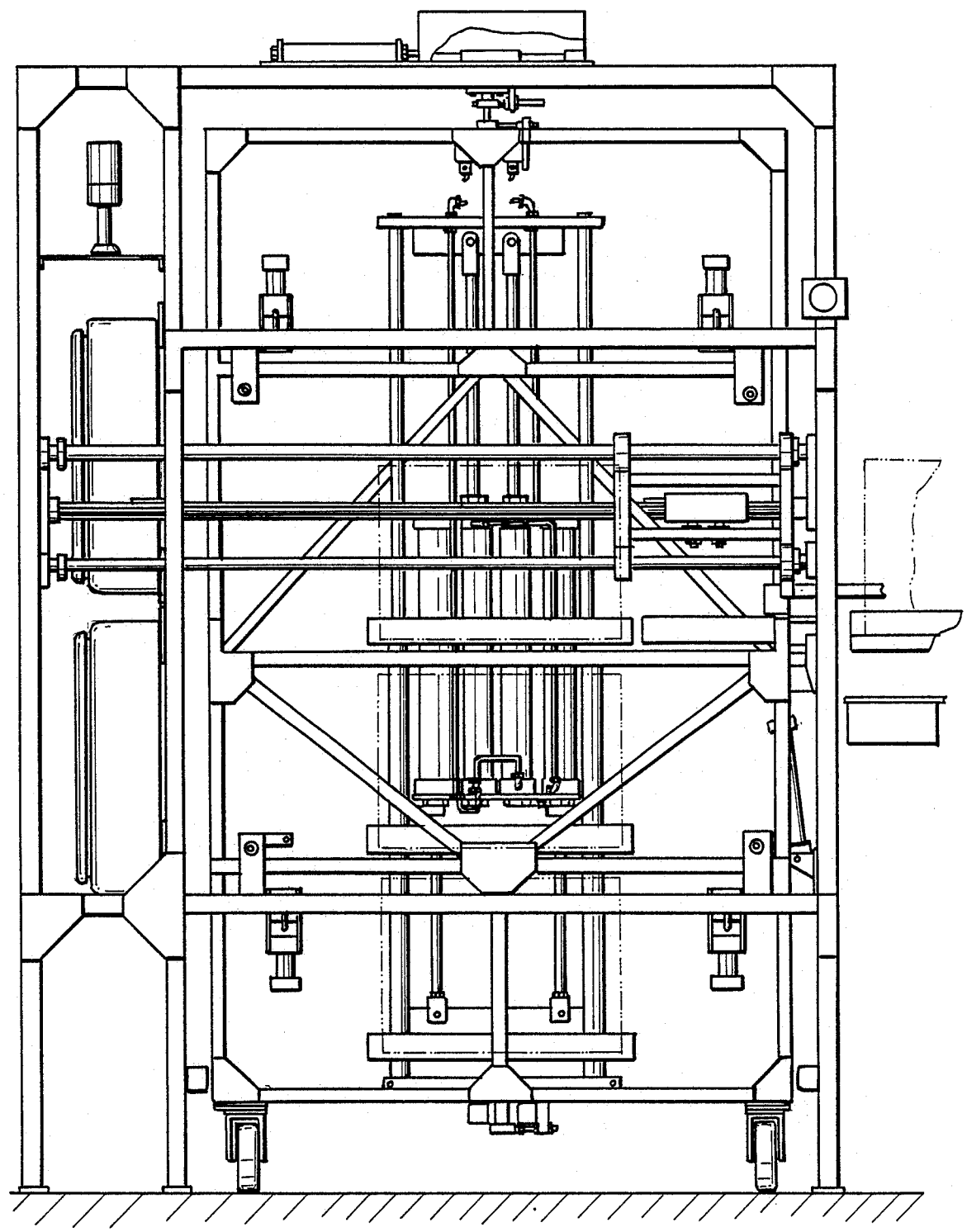
Figure 4:
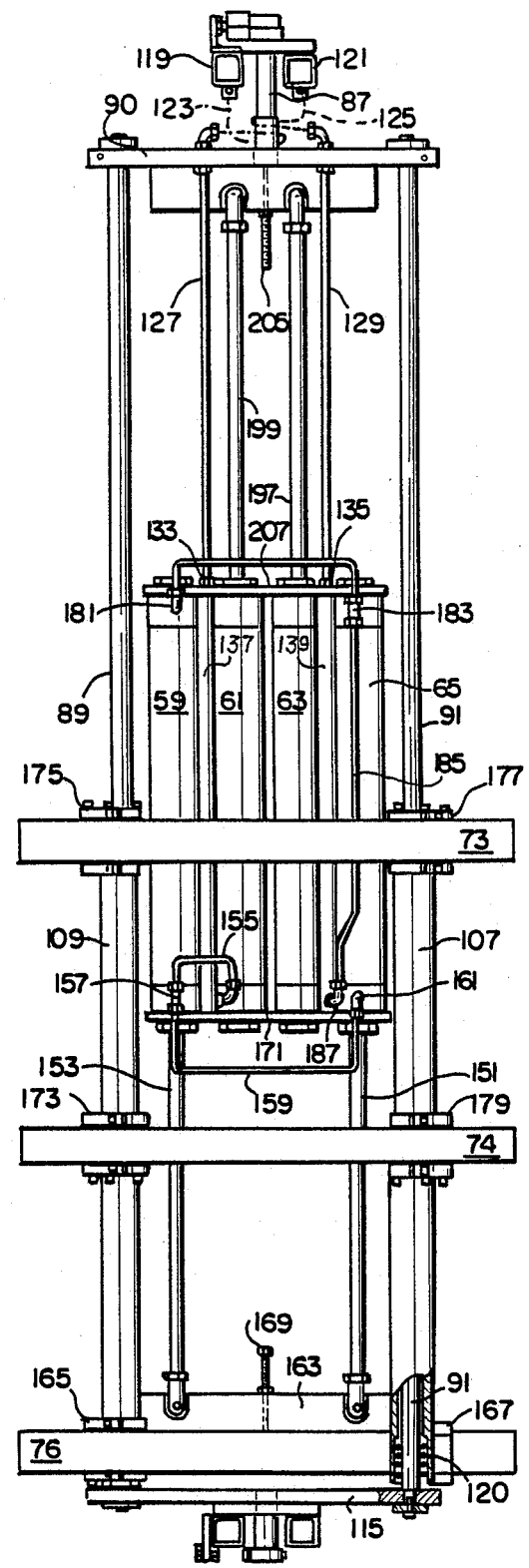
FIG. 4 is a front view of the pneumatic lifting mechanism.
Figure 5:
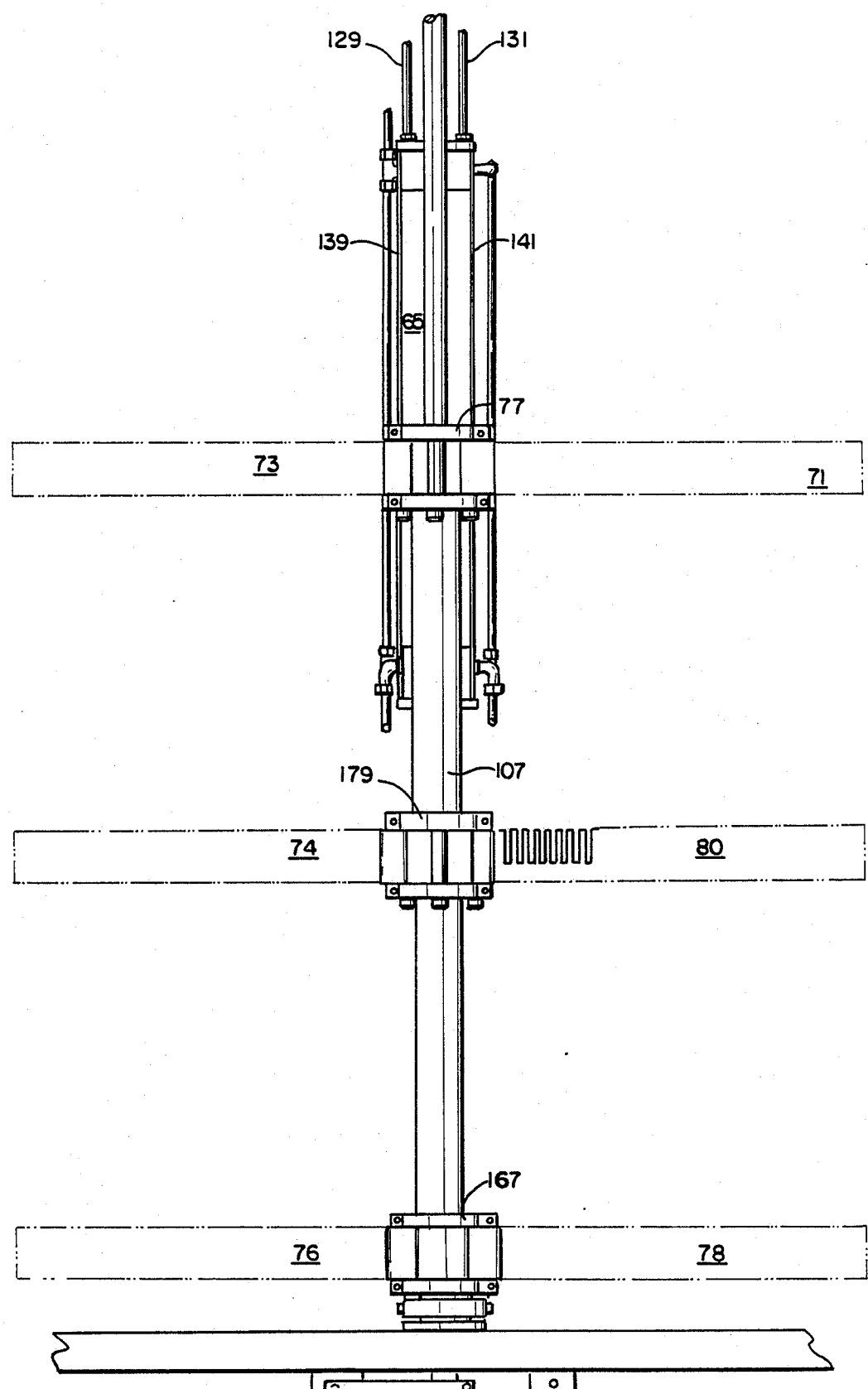
FIG. 5 is an end view of the pneumatic lifting mechanism.

As also can be determined from FIGS. 3a, 4 and 5, the rack cassettes are secured to the support members 107 and 109. The support members are hollow and move over the two vertical guide and support rods 89 and 91 which can be seen in FIGS. 3a, 4 and 5. The vertical support rods 89 and 91 are secured to the horizontal member 90 at the top and to a similar horizontal member 115 at the bottom of the structure. The horizontal member 115 can be best seen in FIG. 4. The horizontal member 90 is connected to the rotating torque actuator 118 by virtue of the rod 87 which can be seen in FIG. 4. The rotating torque actuator 118 is a commercial item which can be obtained from the Boston Gear Company which is a division of Rockwell Corporation. The rotating torque actuator includes a bidirectional piston device 117 which bidirectionally moves a horizontal gear means. The horizontal movement is translated by a circular gear into a rotating movement and the rotating movement through the shaft 87 effects a rotational movement of the horizontal member 90. This action forces the horizontal member 90 and its counterpart 115 to rotate one hundred and eighty degrees in both the clockwise direction and the counter-clockwise direction. A clockwise direction is followed at a later time by a counter-clockwise direction by changing the direction of the movement of the bidirectional piston means. Accordingly, the vertical support rods 89 and 91 are also rotated one hundred and eighty degrees. Since the support members 107 and 109 are coupled to the vertical support rods 89 and 91, this causes the racks with the rack cassettes thereon to be rotated one hundred and eighty degrees. In a preferred embodiment the Origa Rodless Cylinder, the torque actuator and the pneumatic cylinder that effects the rotating movement of the ramp device 77, are all controlled by individual hydraulic "Cylinder-Checks" to insure linear motion speed.

The cut away section of FIG. 4 shows that the rod 91 is coupled to the support member 107 through a bearing arrangement 120 thus enabling the support member 107 to move up on the support rod 111 without "freezing up." A similar arrangement of course is provided for the support member 109 with respect to the guide support rod 89. If we consider that the rack cassette 71 has been emptied and the proper proximity switch generates a signal indicating that the ramp is "up," then the rotating actuator will be activated to move the rack cassette 73 into the position whereat cassette 71 is shown in FIG. 2a. Bear in mind that as described before, the ramp device 77 will be pushed upward out of the way prior to the rotating action of the racks. After the rack cassette 73 has been emptied in the fashion similar to the one described earlier, the rack is rotating to its home position and the second level of rack cassettes will be moved up into the feeding position in a manner to be described hereinafter. When the first rack cassette of the second level has been emptied, the rotating actuator will move the structure as just described, counter-clockwise to move the fourth rack cassette or the second rack cassette of the second level into the feeding position. The same operation takes place for the third level of rack cassettes. The third level of rack cassettes will be rotated clockwise to effect the same operation as described above.

Figure 6:
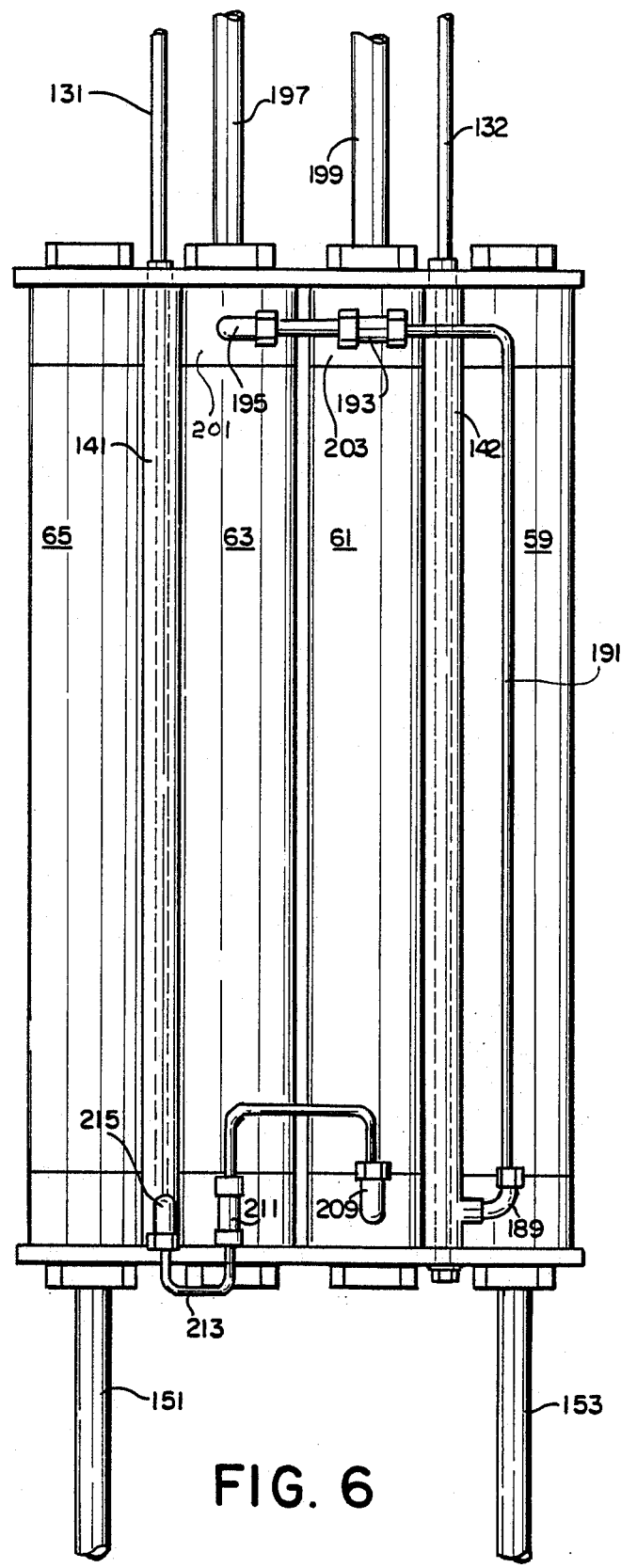
FIG. 6 is a rear view of the pneumatic lifting mechanism.

The system employed to raise the three levels of cassettes can best be seen in FIG. 4. In FIG. 4 there are shown two conduits 119 and 121 which provide air through flexible hoses 123 and 125 to the hollow rods 127 and 129. Actually there are four such rods with the third lying behind the rod 127 and the fourth lying behind the rod 129 as viewed in FIG. 4. The fourth rod can be seen in FIG. 5 and has been identified as hollow rod 131. The third rod 132 can be seen in FIG. 6. The hollow rods 127 and 129 are respectively coupled through the seals 133 and 135 into the conduits 137 and 139. In FIG. 4 the conduits 137 and 139 are shown as having hollow bores (dashed lines) within those conduits. In FIG. 5, the conduit 139 is shown extending partially beyond the cylinder and the conduit 141 which accommodates the hollow rod 131, is shown extending beyond the cylinder 65. In FIG. 6, which is a back view of the cylinder and conduit arrangement shown in FIG. 4, the third hollow rod 132 can be seen along with its conduit 142 as well as the arrangement of the cylinders 59, 61, 63 and 65.

Consider FIG. 4. Within each of the cylinders 65 and 59 there is located a movable piston. The piston in the cylinder 65 is coupled to the rod 151 while the piston within the cylinder 59 is coupled to the rod 153. When air is forced into the system from the conduit 119, through the flexible conduit 123, through the hollow rod 127, into the conduit 137, that air is forced further through the connecting line 155 and through a connector 157 into the cylinder 59. At the same time, the air is forced through the air line 159, through a further connector 161 into the cylinder 65.

When the pressurized air enters the cylinder 59 hrough the input connector 157 it forces the piston in the cylinder 59 to move upward. At the same time the pressurized air entering the input connector 161 forces the piston in the cylinder 65 to move upward. The pistons in the cylinders 59 and 65 are connected respectively to the rods 153 and 151 and hence as the pistons move upward they pull the rods 153 and 151 upward. The rods 153 and 151 are coupled through the support bar 163 and through the circular clamps 165 and 167 to the support members 107 and 109. The circular clamp members 165 and 167 also provide a support for the shelves 76 and 78. It should be noted that the circulator clamp members 173 with 179 and 175 with 177 respectively provide support for the shelves 73 and 71 as well as 74 and 80. The circular clamp members 173, 175, 177 and 179 are all secured to support members 107 and 109. Accordingly as the pistons in the cylinders 65 and 59 move upward, the rods 151 and 153 are pulled upward and this in turn pulls up the support members 107 and 109. Hence the shelves 71, 73, 74, 76, 78 and 80 with their rack cassettes are also pulled upward. It should be noted that at the center of the support bar 163 there is located a stop device 169. The stop device can be mechanically lowered or raised and this provides a positive stop so that when the structure is raised upward, the stop 169 can (if necessary) come to rest against the bottom of the structure holding the cylinders, at the location 171 thus determining the limit of travel.

In FIG. 5, which is the side view of the arrangement shown in FIG. 4, it can be noted that in addition to the shelves 73, 74 and 76 the shelves 71, 80 and 78 are also shown. It can also be gleaned from FIG. 5, that the circular clamps 177 and 179 as well as circular clamp 167 are shown supporting the shelves and coupling them to the support member 107.

Consider now the further operation of the pneumatic system to raise the shelves. When the pistons in the chambers 59 and 65 are being pushed upward, the air ahead of those pistons must be exhausted. This is effected by permitting that air to escape through the output ports 181 and 183 into the tubing 185, through the fixture 187 into the conduit 139, through the hollow tube 129, back into the flexible tubing 125 and to the conduit 121 which leads to the pneumatic control. Hence there is a complete pneumatic circuit to feed the pressurized air in and let the trapped air escape thus letting the pistons move upward. This first upward movement places the shelf 74 in the feeding position while shelf 80 will be rotated into the feeding position at a later time.

When the system requires that the shelves 76 and 78 be moved to the feeding position to provide PWBs to the indexing-loader-cassette, then the programmable control is activated in response to a signal from a proximity switch which in turn activates the pneumatic system to provide pressurized air to the hollow rod 132 in FIG. 6. The air passes through the hollow rod 132, along the conduit 142 into the fixture 189, along the tubing 191 to the two input fixtures 193 and 195. It will be recalled, as mentioned earlier, that in the cylinders 63 and 61 there are two pistons which are connected to the support rods 197 and 199. As the air enters through the input ports 193 and 195 it pushes against the pistons and thereby forces the upper sections 201 and 203 of the cylinders 63 and 61 upward. Since the cylinder structure is coupled through the support rods 151 and 153 to the structure holding the racks, then, as described earlier, the entire rack system will move upward. Consider FIG. 4 and it can be seen there is a mechanical stop 205 which prevents the upper section of the cylinders (at position 207) from going beyond where the mechanical stop 205 is located. It should be noted that the hollow rods 127 and 129 as well as the hollow rods 131 and 132 move into the hollow air conduits and in no way impede the upward movement of the cylinder in the rack system. In a similar fashion to that described earlier, the air which is in front of the pistons in cylinders 63 and 61 must be able to escape. The escape of such air is provided by the output fixtures 209 and 211, through the tubing 213, through the exit connection 215, through the hollow conduit 141, through the hollow rod 131 and back into the conduit 121, shown in FIG. 4.

The system for raising the shelves by the pneumatic power and the cylinder structure shown in FIGS. 4, 5 and 6 has been described above. The reverse procedure is true when the system is to be lowered. In other words, when the racks are to be lowered, rather than depend upon gravity pull (which indeed helps to some extent) there is air forced initially into the hollow tub 131, through the conduit 141, through the fixture 215 and into the ports 211 and 209. This air pushes against the fixed pistons in the cylinders 63 and 61 thereby forcing the system downward and the air behind those pistons escapes through the ports 195 and 193 and through the tubing 191, back through the fixture 189, up through the conduit 142, and out the hollow tubing 132. A similar action would take place for the second step of lowering the rack and that would involve providing air through the hollow rod 129, through the hollow conduit 139, out through the fixture 187, through the tubing 185 into the ports 183 and 181 which would force the pistons in the cylinders 59 and 65 downward. The air behind the pistons would exit through the ports 161 and 157, through the tubing 155, through the conduit 137, through the hollow rod 127 and finally to the air control values.

While it has not been mentioned heretofore, it should be understood that the pusher 75 is in the home position, i.e., "out of the way," when the rack is rotated. This is effected by the proximity switch which is located behind the electronic control housing 69 and therefore can not be seen in FIG. 3a.

Figure 2B:
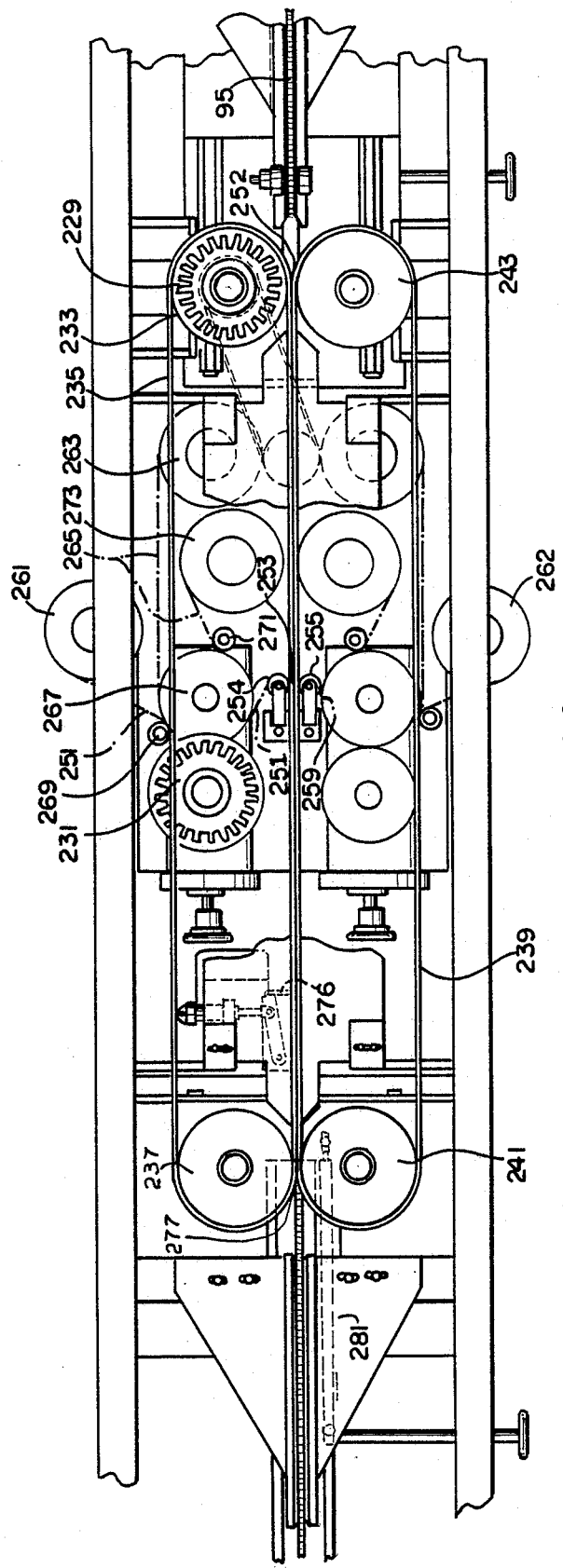
Figure 2D:
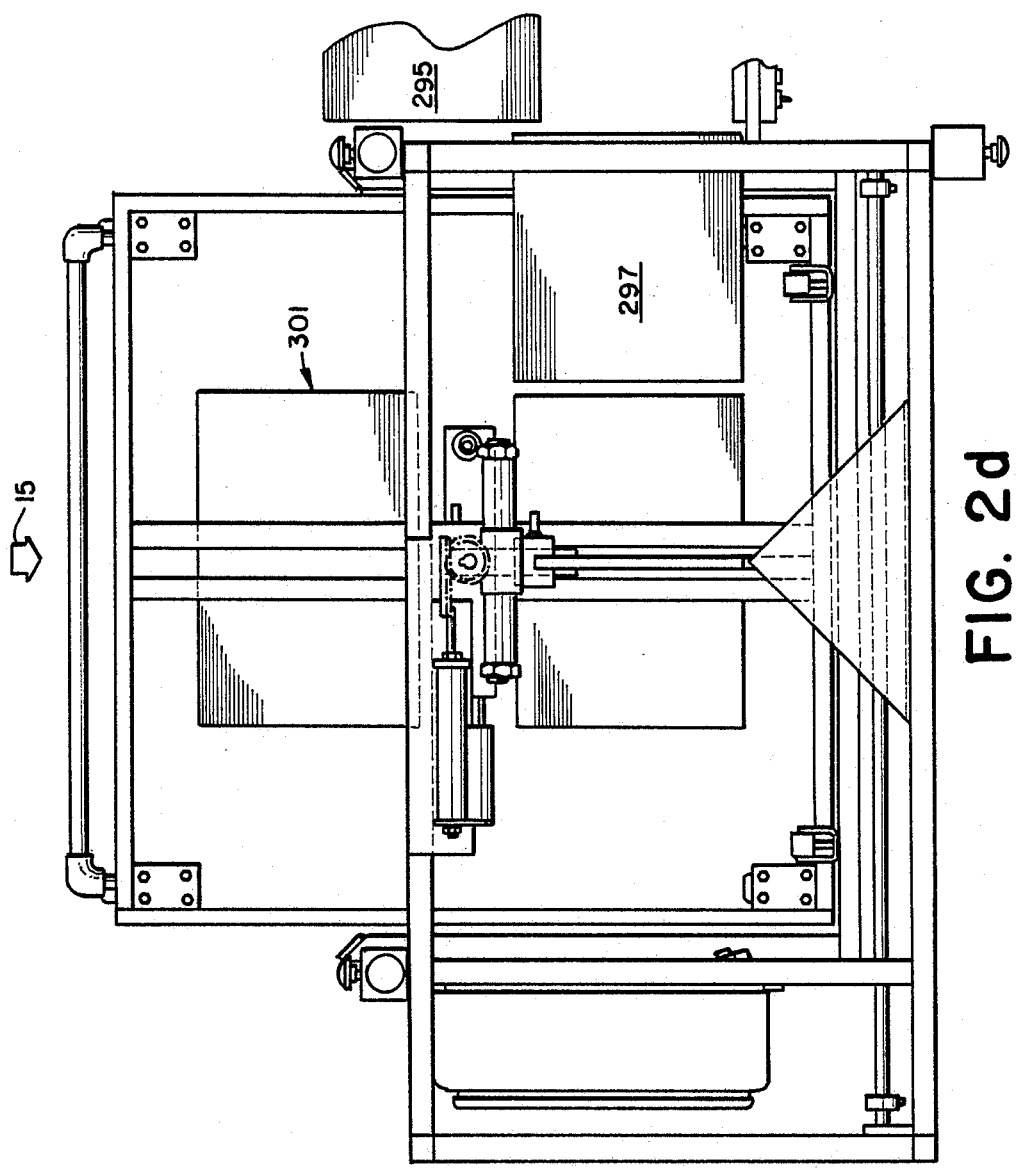
Figure 7:
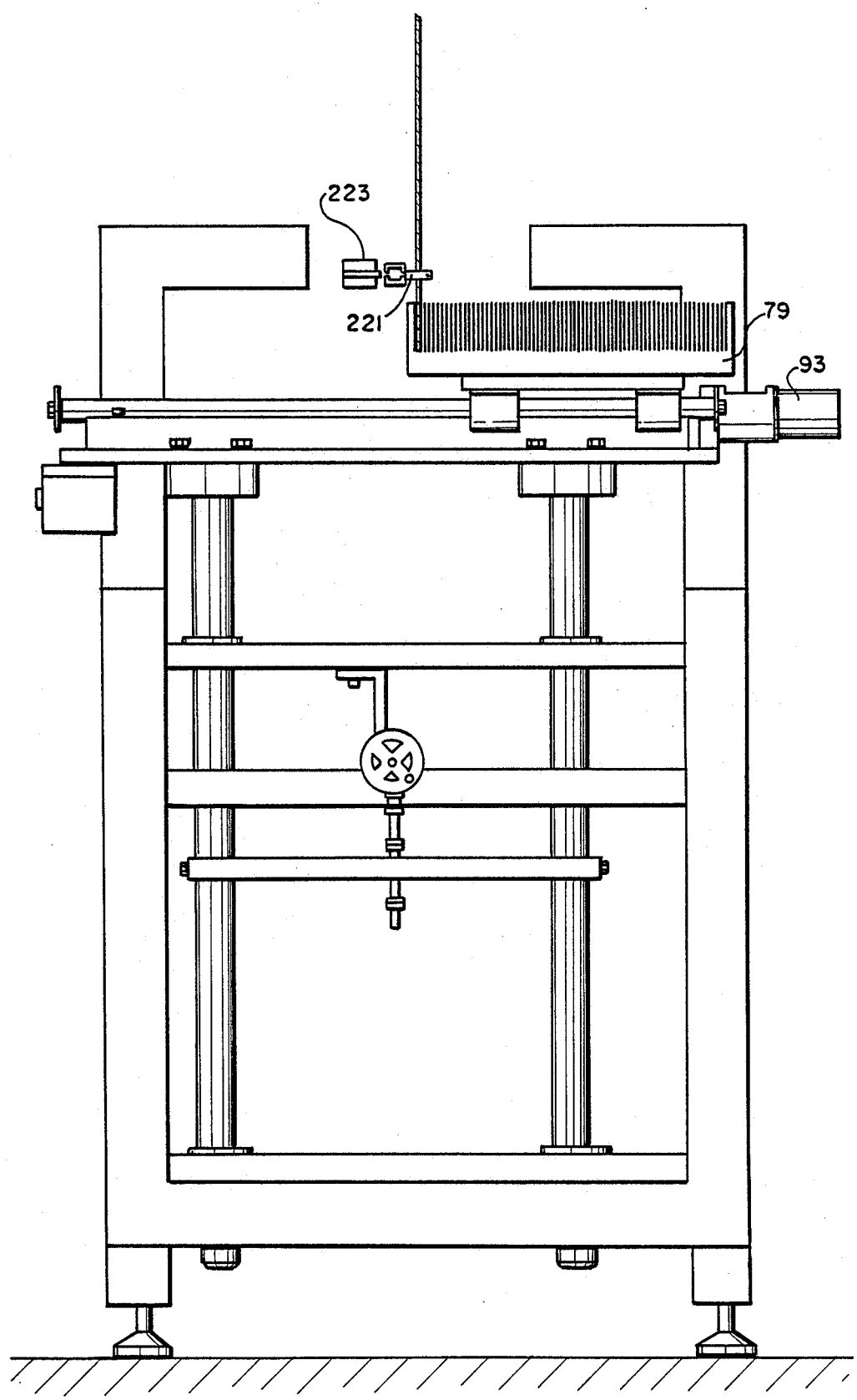
FIG. 7 is an end view of the positioning table cassette station.

Consider now the operation of the system shown in FIGS. 2a to 2d and 3a to 3d i.e., from the time the PWBs have been located on the indexing- loader-cassette 79. As part of the indexing-loader station 217 there is included a stepping motor 93, which step by step rotates the lead screw 219, which in turn steps the indexing-loader-cassette 79 (downward in the drawing) one PWB at a time. The pusher device 221, which can be best seen in FIG. 7, is connected to the rodless cylinder 223. The rodless cylinder 223 is controlled from the pneumatic controls in the housing 67 to move the pusher 221 completely to the left as viewed in FIG. 2a, so that the bottom most PWB, as viewed in FIG. 2a, or the left hand most PWB, as viewed from the right hand end (i.e., as in FIG. 7) will be transferred into the transfer station 25. It should be recognized from FIGS. 2 and 7, that the indexing-loader-cassette 79 passes with the empty cassette slots under the rodless cylinder 223. The cassette 79 moves on the tracks 225 and 227. As explained earlier when there is no longer any PWB board in the indexing-loader-cassette 79, automatic return of the empty cassette 79 is effected by having the programmable controller count to fifty. A full load in cassette 79 is fifty PWBs. If less than fifty PWBs were present in cassette 79, the return of the cassette would be accomplished by manually pushing certain buttons. In both the automatic mode and manual mode the generated signals operate to reverse the stepping motor 93 at a fast rate, thereby repositioning the table cassette 79. When the cassette 79 is returned to its home position the system is signaled to transfer another set of PWBs from whichever rack is in the feeding position, i.e., the position whereat rack 71 is shown in FIG. 2a.

A PWB which has been transferred from the indexing-loader-cassette 79 to the transfer station 25 is moved from that transfer station by the action of a signal generated by a coincidence occurrence between signals generated respectively by the rotary transducer 229 and the rotary transducer 231. As mentioned earlier, the rotary transducers are rotary inductosyn transducers manufactured by Farrand Controls Company although it should be understood that other forms of signal generating devices could be used.

The rotary transducer 229 is secured to the pulley 233. The pulley 233 is driven by the belt 235 which in turn is driven by the pulley 237. The belt 239 is driven by the pulley 241 around the pulley 243. The belts 235 and 239 grip the PWBs when the PWBs leave the transfer station 25 and carry them by friction through the masking tape application station 27. In a preferred embodiment, the pulleys 237 and 241 are driven by the servo motor 245 (see FIG. 3a). In a preferred embodiment the servo motor 245 can be any well known d.c. servo motor which provides ¾ horsepower and a rotary speed of 1800 rpm. The rotary transducer 229 is secured to the pulley 233 (which is behind pulley 243 in FIG. 3a) and it generates a series of electrical pulses as it is rotated. In addition, in the masking tape application station 27, there is a rotary transducer 231 which is secured to a die cutting cylinder 247, shown in FIG. 3a. The die cutting cylinder 247 and the rotary transducer 231 are driven by the d.c. servo motor 249 shown in FIG. 3a. The d.c. servo motors 245 and 249 are identical motors and each can be adjusted to change its speed and thus change the speeds of the rotary transducers 231 and 229. It should be understood that the PWBs should enter the nip 252 (shown in FIG. 2b) between the belts 235 and 239, at such time that each PWB passing through the masking tape application station 27 (between the belts 235 and 239) reaches the position 253 between the pinch rollers 254 and 255 at a particular time. By the time that the masking tapes 251 and 259 reach the pinch rollers 254 and 255, any patterns which are to be cut from the masking tapes will have been cut. If the masking tapes were not applied to the PWBs at the correct time, the cut out patterns would be fitted over an incorrect section, or incorrect sections, of the PWB. Accordingly the timing between the rotary transducer 231 and the timing of the rotary transducer 229 must be synchronized. Prior to putting the system into useful operation a number of "dummy" PWBs are transported through the masking tape application station 27. While the "dummy" PWBs are being transported, the output signals from the rotary transducers 229 and 231 are observed on a monitor, or a cathode ray tube oscilloscope.

While monitoring the signals, the speed of one of the servo motors (or both of the servo motors) is adjusted until the pulses on the oscilloscope are matching or are in some predetermined useful arrangement. When the signals on the oscilloscope are in the matching mode, the user then considers that the belt speed and the die cutting cylinder speed are in synchronism. It should be understood that other techniques for getting the belt speed to be in synchronism with the masking tape speed or the rotary die speed can be employed. When the speed of the belts and the masking tape have arrived at synchronism, then the system can be put into useful operation and it is thereafter that the pusher 221 (FIG. 7) advances the PWBs from the transfer station 25 into the nip 251. The foregoing procedure enables the PWBs to have the masking tape with or without the patterns cut therefrom applied at the correct time and in an exact position selected for a special masking need.

If we examine FIG. 2b more closely, we can glean therefrom how the masking tape is advanced and cut. We will only consider the upper applicator means as viewed in FIG. 2b because the lower applicator means is a mirror image thereof. On the upper side there is located a roll of masking tape wound on the roller 261. On the roller 263 there is located backing tape 265. The backing tape 265 and the masking tape 251 are threaded over the anvil roller 267, between the pinch roller 269 and the anvil roller 267. The masking tape 251 and backing tape 265 are positioned between the anvil roller 267 and the die cutting cylinder 247 (FIG. 3b), whereat the patterns are cut from the masking tape. It should be realized that the cut is only so deep, that the backing tape remains uncut. As can be seen in FIG. 2b, the masking tape 251 is pulled away from the backing tape 265, over the pinch roller 254. The backing tape 265 with the cut outs sticking to its adhesive surface is pulled over the pinch roller 271 to be rolled up, or rewound, on the roller 273. An identical operation occurs on the other side (the lower side shown in FIG. 2b). While the anvil roller 267 is driven through a gear chain 275 (FIG. 3b), the PWBs, with the masking tape clinging thereto, passing between the belts 235 and 239, provide the pulling force for the masking tape. The backing tape rewind roller 273 is rotated by the gear chain (not shown) connected to the anvil roller 267. Accordingly PWBs entering the nip 251 reach the nip 253 of the pinch rollers 254 and 255 at the correct time. As mentioned above the cut out patterns cling to the backing tape 265 and are thus removed from the masking tape. Hence the masking tape with the patterns cut therefrom is correctly applied to the PWBs. The rotary cutting cylinder 247 in a preferred embodiment is manufactured by The Bernal Company.

As described earlier there is a section of the masking tape, which bridges the gap, between each pair of PWB boards as they pass through the masking tape application station 27. When the masking tape, which bridges the gap, is positioned opposite the knife 276, the knife 276 is activated to slice the masking tape, thereby leaving the PWB boards separated and independent of one another. In a preferred embodiment the knife 276 is part of a tape cut off mechanism manufactured by the 3M Company of St. Paul, Minn. Since the speed of the belts is known, the electrical control system counts (starting at each coincidence of signals between the rotary transducers) the number of pulses that equals the correct time for a PWB to pass from the nip 251 so as to have the center of the gap, between it and a preceding board lying opposite the knife 276. When the microcomputer in the electronic control system counts the proper number, the tape which is bridging the gap between the PWBs will be in the proper position for cutting and the tape cut off mechanism will be activated.

The separated PWB boards continue the excursion from the nip 277 into the transfer station 33 (FIG. 2c). As can be seen in FIG. 2c, the PWBs are pushed from the transfer station 33 by the pusher 279 which is moved along by the rodless cylinder 281. The pusher 279 is activated by the synchronism of a signal by the rotary transducer 283 with the rotary transducer 229 (in a manner which is similar to that previously described in connection with the rotary transducers 229 and 231). The system wants to keep the PWBs moving at a constant rate. Therefore the PWBs are pushed from the transfer station 33 so that the rate of movement of the PWBs is constant. The PWBs are moved out of the transfer station 33 into the buffing station 35. In the buffing station 35 there are two buffing rollers 285 and 287 (FIGS. 2c and 3c). The buffing rollers 285 and 287 attempt to come in contact w1th one another and in effect firm up, or push, the masking tape very firmly against and into the PWBs. The rollers are made of material which has the characteristic which enables it to be pushed and assume the configuration of the circuit paths of the board at the place where the rollers attempt to come together. In this way the voids, that would normally exist between the masking tape and the circuit pattern on the PWB, are "filled in" by the masking tape so that no plating material can seep in between the masking tape and a PWB. The buffing roller mechanism, in a preferred embodiment, is manufactured by the 3M Company of St. Paul, Minn.

After the masking tap has been buffed or firmly pushed against a PWB in the buffing station, that PWB continues its excursion through the nip 289 (FIG. 2c) into the final transfer station 37. The PWBs are advanced from the transfer station 37 by the pusher 291, which operates with the rodless cylinder 293, in a manner similar to that described in connection with the pusher 279 and the rodless cylinder 281. The PWBs are pushed by the pusher 291 into the indexing-loader-cassette 295. The PWBs are not evenly aligned as they go into the indexing-loader-cassette 295 but that is not of any great consequence because when the indexing-loader-cassette 295 is fully loaded, the pusher device 280 pushes all of boards at one time, over the ramp device 297 in a fashion, similar, but in a reverse sense to that described earlier in connection with the ramp device 77 and the indexing-loader-cassette 79. The worm screw arrangement 299 shown in FIGS. 2c steps the indexing-loader-cassette 295 downward so that the boards are loaded as viewed in the drawing from the bottom upward. When the indexing-loader-cassette 295 is fully loaded, the pusher 280 advances the PWBs as a group over the ramp device 295 onto a rack cassette in the movable receiving device 301. In a reverse sense the operation is similar to that previously described with respect to the movable loader device 11. The movable loader 11 loads PWBs while the movable receiving device receives PWBs.

The present system provides a means for automatically moving PWBs, which are in a vertical standing mode, through a system whereat they are subjected to an operation of some kind. In the described embodiment, the PWBs have masking tape applied thereto. The operation could be gold plating or some other treatment. The PWBs are placed on the movable loader while the movable loader sits external to the system. The movable loader includes a unique pneumatic lifting system to accommodate a multiple level rack system. All of the foregoing features lead to the novel automatic processing.

I claim:

1. Masking tape applicator means for applying masking tape to planar items being processed comprising in combination: first and second belt means; first and second belt driving means respectively coupled to said first and second belt means and disposed to drive said first and second belts along a transport path whereat said belts form a first nip and come in close proximity to move said items therebetween with at least said first belt driving means being formed to be speed adjustable, the belts forming a second nip, the portions of said belts coming in close proximity extending along said transport path from said first nip to said second nip; means for orienting said planar items in a vertical plane parallel to said transport path for introduction of said items into said transport path at said first nip, said means for orienting including means for supporting lower edge portions of said planar items to register said planar items vertically with respect to said belts whereby said items can be introduced into said first nip to assume a predefined vertical orientation during movement along said transport path; masking tape supply means disposed in close proximity to said belt means; first roller series means disposed to direct masking tape from said masking tape supply means to an application position along said transport path; third driving means formed to be speed adjustable and coupled to said first roller series means to drive at least a portion of said first roller series means; first and second signal generating means coupled respectively to said first and third driving means whereby said first belt driving means and said third driving means can be synchronized by monitoring signals generated by said first and second signal generating means; and masking tape applicator means wherein there is further included an item pusher means which is formed to push an item into said first nip in response to a predetermined relationship between signals generated by said first and second signal generating means; wherein said first roller series includes a die cutting cylinder and an anvil roller whereby patterns are cut from said masking tape as said masking tape is directed through said first roller series.

2. Masking tapeapplicator means according to claim 1 wherein there is further included a backing tape supply means and second roller series means disposed to direct said backing tape into said first roller series means whereby said backing tape is moved in back of said masking tape at least when said masking tape passes by said die cutting cylinder.

3. Masking tape applicator means according to claim 2 wherein said backing tape is formed to have adhesive means in contact with said masking tape whereby said patterns which are cut from said masking tape adhere to said backing tape.

4. Masking tape applicator means according to claim 3 wherein there is further included rewind means disposed to accept and rewind said backing tape after said patterns which are cut form said masking tape are adhering to said backing tape.

5. Masking tape applicator means accord to claim 1 wherein said first belt driving means and said third driving means are synchronized so that the patterns cut from asid masking tape will overlay the intended areas of said item when said masking tape is applied.

6. Masking tape applicator means for applying masking tape to items being processed comprising in combination: first and second belt, means; first and second belt driving means respectively coupled to said first and second belt means and disposed to drive said first and second belts along a transport path thereat said belts form a nip and come in close proximity to move said items therebetween with at least asid first belt driving means being formed to be speed adjsutable; masking tape supply means disposed in close proximity to said belt means; first roller series means disposed to direct masking tape from said masking tape supply means to an application position along said transport path; third driving means formed to be speed adjustable and coupled to said first roller series means to drive at least a portion of said first roller series means; first and second signal generating means coupled respectively to said first and third driving means whereby said first belt driving means and said third driving means can be synchronized by monitoring signals generated by said first and second signal generating means; and item pusher means which is formed to push an item into said nip in response to a predetermined relationship between signals generated by said first and second signal generating means; wherein said first roller series means includes a die cutting cylinder and an anvil roller whereby patterns are cut from said masking tape as said masking tape is directed through said first roller series.

7. Masking tape applicaotr means according to claim 6 wherein there is further included a backing tape supply means and second roller series means disposed to direct said backing tape into said first roller series means whereby said backing tape is moved in back of said masking tape at least when said masking tape passes by said die cutting cylinder.

8. Masking tape applicator means according to claim 7 wherein said backing tape is formed to have adhesive means in contact with said masking tape whereby said patterns which are cut from said masking tape adhere to said backing tape.

9. Masking tape applicator means according to claim 8 where there is further included rewind means disposed to accept and rewind said backing tape after said patterns which are cut from said masking tape are adhering to said backing tape.

10. Masking tape applicator means according to claim 6 wherein said first belt driving means and said third driving means are synchronized so that the patterns cut from said masking tape will overlay the intended areas of said item when said masking tape is applied.

11. Masking tape applicator means for applying masking tape to items being processed comprising in combination:

means for conveying said items to be processed along a transport path, masking tape supply means;

first roller series means disposed to direct masking tape from said masking tape supply means to an application position along said transport path, said first roller series means including a die cutting cylinder and an anvil roller whereby patterns are cut from said masking tape as said masking tape is directed through said first roller series means; and means for driving said first roller series means in synchronism with the transport of an item along said transport path so that the patterns cut from said masking tape will overlay predefined areas of said item when said masking tape is applied at said application position.

12. Masking tape applicator means according to claim 11 wherein said means for driving said first roller series means in synchronism includes signal generating means coupled to said anvil roller, and item pushing means for introducing said item into said conveying means in response to a signal generated by said signal generating means.

13. Masking tape applicator means according to claim 11 wherein there is further included a backing tape supply means and second roller series means disposed to direct said backing tape into said first roller series means whereby said backing tape is moved in back of said masking tape at least when said masking tape passes by said die cutting cylinder.

14. Masking tape applicator means according to claim 13 wherein said backing tape is formed to have adhesive means in contact with said masking tape whereby said patterns which are cut from said masking tape adhere to said backing tape.

15. Masking tape applicator means according to claim 14 wherein there is further included rewind means disposed to accept and rewind said backing tape after said patterns which are cut from said masking tape are adhering to said backing tape.

* * * * *

UNITED STATES PATENT AND TRADEMARK OFFICE
CERTIFICATE OF CORRECTION

PATENT NO. : 4,804,434
DATED : 02/14/89
INVENTOR(S) : Hasso Von Kraewel

It is certified that error appears in the above-identified patent and that said Letters Patent is hereby corrected as shown below:

Col. 2, line 12, please change "and" to --to--.

Col. 4, line 53, please change "w&th" to --with--.

Col. 8, line 53, please change "furthrr" to --further--.

Col. 8, line 59, please change "hrough" to --through--.

Col. 10, line 36, please change "ln" to --in--.

Col. 10, lines 37-38, please change "indexing- loader-cassette" to --indexing-loader-cassette--.

Col. 13, line 7, please change "w1th" to --with--.

Col. 14, line 34, please change "tapeapplicator" to --tape applicator--.

Col. 14, line 49, please change "form" to --from--.
Col. 14, line 54, please change "asid" to --said--.

Col. 14, line 58, after "belt", please cancel ",".

Col. 14, line 61, please change "thereat" to --whereat--.

Col. 14, line 63, please change "asid" to --said--.

Col. 14, line 64, please change "adjsutable" to --adjustable--.

UNITED STATES PATENT AND TRADEMARK OFFICE
CERTIFICATE OF CORRECTION

PATENT NO. : 4,804,434

DATED : 02/14/89

INVENTOR(S) : Hasso Von Kraewel

It is certified that error appears in the above-identified patent and that said Letters Patent is hereby corrected as shown below:

Col. 15, line 16, please change "applicaotr" to --applicator--.

Signed and Sealed this

Twenty-sixth Day of June, 1990

Attest:

*Attesting Officer*

HARRY F. MANBECK, JR.

*Commissioner of Patents and Trademarks*